United States Patent [19]

Patalong

[11] Patent Number: 4,611,128
[45] Date of Patent: Sep. 9, 1986

[54] TRIAC HAVING A MULTILAYER SEMICONDUCTOR BODY

[75] Inventor: Hubert Patalong, Munich, Fed. Rep. of Germany

[73] Assignee: Siemens Aktiengesellschaft, Berlin & Munich, Fed. Rep. of Germany

[21] Appl. No.: 199,519

[22] Filed: Oct. 22, 1980

[30] Foreign Application Priority Data

Nov. 9, 1979 [DE] Fed. Rep. of Germany ....... 2945380

[51] Int. Cl.[4] .......................................... H03K 17/60
[52] U.S. Cl. .............................. 307/252 B; 357/23.4; 357/23.12; 357/39; 357/86
[58] Field of Search ...................... 357/38, 39, 23, 86; 307/252 B

[56] References Cited

U.S. PATENT DOCUMENTS

| 3,243,669 | 3/1966 | Sah | 317/234 |
|---|---|---|---|
| 3,360,696 | 12/1967 | Neilson et al. | 357/39 |
| 3,742,318 | 11/1971 | Yamashita | 357/38 |
| 3,753,055 | 8/1973 | Yamashita et al. | 357/38 |
| 3,831,187 | 8/1974 | Neilson | 357/38 |
| 3,858,235 | 12/1974 | Schild | 357/38 |
| 3,891,866 | 6/1975 | Okuhara et al. | 307/252 A |
| 3,896,476 | 7/1975 | Kawakami | 357/38 |
| 4,016,592 | 4/1977 | Yatsuo et al. | 357/38 |
| 4,087,834 | 5/1978 | Temple | 357/38 |
| 4,092,703 | 5/1978 | Sueoka et al. | 357/86 |
| 4,142,201 | 2/1979 | Sittig et al. | 357/38 |
| 4,199,774 | 4/1980 | Plummer | 357/23 |
| 4,219,833 | 8/1980 | Temple | 357/38 |
| 4,224,634 | 9/1980 | Svedberg | 357/38 |
| 4,243,998 | 1/1981 | Schlangenotto et al. | 357/38 |
| 4,244,000 | 1/1981 | Ueda et al. | 357/38 |
| 4,301,462 | 11/1981 | Lowry | 357/38 |
| 4,331,884 | 5/1982 | Svedberg | 357/38 |

FOREIGN PATENT DOCUMENTS

| 2040657 | 2/1972 | Fed. Rep. of Germany | 357/38 |
|---|---|---|---|
| 2149760 | 4/1972 | Fed. Rep. of Germany | 357/38 |
| 52-35586 | 3/1977 | Japan | 357/38 |

OTHER PUBLICATIONS

Blicher, A., Transistor Physics, Springer-Verlag, New York, Heidelberg, Berlin, 1976, pp. 131–135.
B. Baliga, "Enhang and Depl. Vert. Chan. MOS Gated Thyrs.", Electr. Lett., Sep. 27, 1979, vol. 15, #20, pp. 645–647.
J. Plummer et al., "Insulated-Gate Planar Thyrs. I & II", IEEE Trans. on Elec. Dev., vol. Ed-27, #2, Feb. 1980, pp. 380–394.

Primary Examiner—Joseph E. Clawson, Jr.
Attorney, Agent, or Firm—Hill, Van Santen, Steadman & Simpson

[57] ABSTRACT

In a triac having a multilayer semiconductor body arranged between two electrodes, in which a first layer forms the p-base layer of a first thyristor and the p-emitter layer of a second thyristor, a second layer represents the n-base layers of both thyristors and a third layer forms the p-emitter layer of the first thyristor and the p-base layer of the second thyristor, and in which the n-emitter layer of the first thyristor is disposed in the first layer and an n-emitter of the second thyristor is disposed in the third layer, a gate-controlled MIS structures are provided which contain controllable emitter short circuit paths, the provision being at the n-emitter layer of the first thyristor and at the p-emitter layer of the second thyristor in the boundary area of both thyristors.

10 Claims, 2 Drawing Figures

TRIAC HAVING A MULTILAYER SEMICONDUCTOR BODY

BACKGROUND OF THE INVENTION

1. Field of the Invention

This invention relates to a triac having a multilayer semiconductor body which is arranged between two electrodes, in which a first layer forms the p-base layer of a first thyristor and a p-emitter layer of a second thyristor, a second layer represents the n-base layers of both thyristors and a third layer forms the p-emitter layer of the first and the p-base layer of the second thyristor, and in which the n-emitter layer of the first thyristor is included in the first layer and the n-emitter layer of the second thyristor is included in the third layer, and to a method for operating the same.

2. Description of the Prior Art

Triacs of the type generally mentioned above are known, for example, from the book "Thyristor Physics" by Adolph Blicher, Springer Verlag, Berlin, 1976, pp. 133, FIG. 11.2, and exhibit the disadvantage that they can only be employed given low commutation-dU/dt values. If the voltage applied to the electrodes changes very quickly in the proximity of its zero crossing, then controlled switching operations are no longer possible.

SUMMARY OF THE INVENTION

The object of the present invention is to provide a triac of the type generally mentioned above which guarantees fault-free switching operations, even given high commutation-dU/dt values.

This object is achieved, according to the present invention, in a device of the type set forth above, in that gate-controlled metal-insulator-semiconductor (MIS) structures are provided which contain controllable emitter short circuit paths, the same being provided at the n-emitter layer of the first thyristor and at the p-emitter layer of the second thyristor in the boundary area of both thyristors. The advantage to be obtained in practicing the present invention lies particularly in the fact that a high degree of decoupling of the two thyristors combined to form a triac is achieved, so that the switching operations remain largely uninfluenced by the rate of its zero pause. Further, the on-state properties differ advantageously from traditional triacs in which additional recombination centers are built-in for the purpose of a better mutual decoupling of the two thyristors, due to the excellent decoupling achieved with the assistance of the emitter short circuit paths.

Controllable emitter short circuit paths are known in conjunction with thyristors from U.S. Pat. No. 3,243,669. However, an indication as to the influencing of the decoupling properties of the two thyristors combined into a triac multilayered structure cannot be derived from this publication.

BRIEF DESCRIPTION OF THE DRAWING

Other objects, features and advantages of the invention, its organization, construction and operation will be best understood from the following detailed description, taken in conjunction with the accompanying drawing, on which.

DESCRIPTION OF THE PREFERRED EMBODIMENTS

Figure 1:
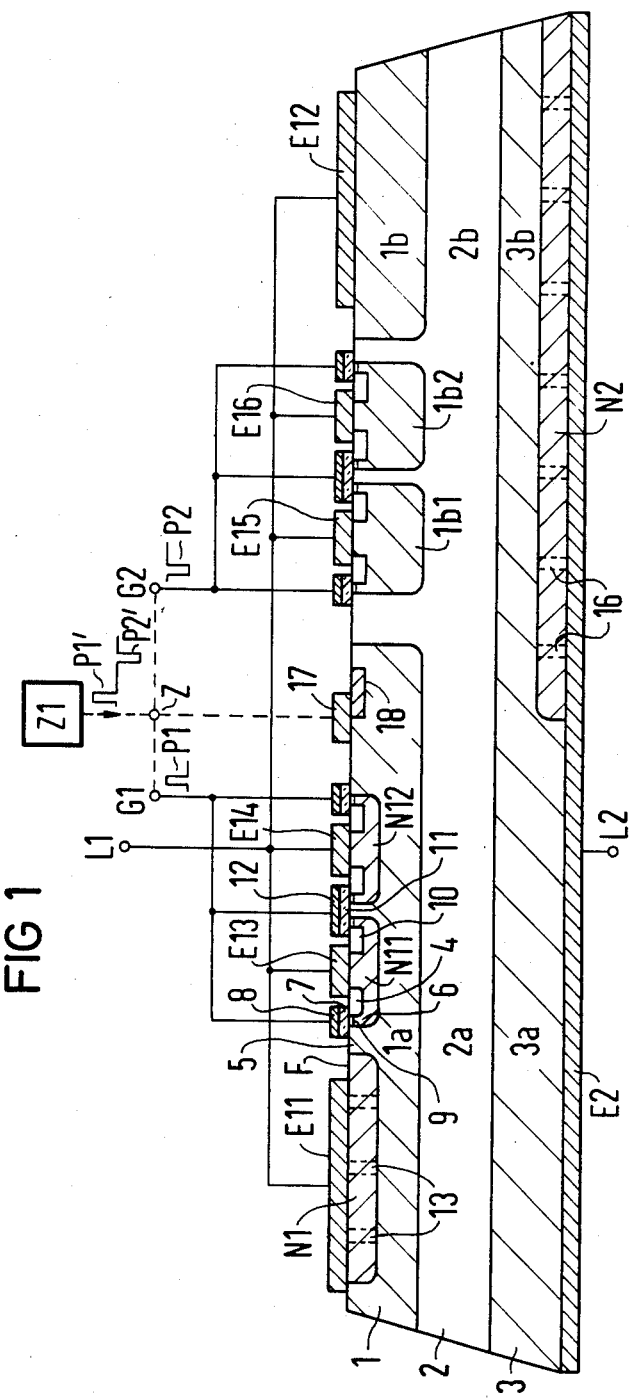
FIG. 1 is a fragmentary cross-sectional view of an exemplary embodiment of the invention.

A triac is illustrated in FIG. 1 whose body is formed of semiconductor layers of alternating conductivity types which consists, for example, of doped silicon. A p-conductive layer 1 comprises both the p-base layer 1a of a first thryristor illustrated in the left-half of FIG. 1, as well as a p-emitter layer 1b of a second thyristor illustrated in the right-half of FIG. 1. An n-conductive layer 2 forms the n-base layers 2a and 2b of both thyristors, whereas a layer 3 comprises a p-emitter layer 3a of the left thyristor and the p-base layer 3b of the right thyristor. An n-emitter layer N1 of the first thyristor is located in the layer 1a, whereas an n-emitter layer N2 of the second thyristor is located in the layer 3b. The layers N1 and 1b are connected to portions E11 and E12 of a first electrode which are connected to a common terminal L1. On the other hand, the layers 3a and 3b are connected to a second electrode E2 which has a terminal L2.

The portion of the n-emitter layer N1 at the right in FIG. 1 is subdivided into two strip-shaped layers N11 and N12 which are respectively connected to further portions E13 and E14 of the first electrode. In an analogous manner, the portion of the p-emitter layer 1b at the left is subdivided into two strip-shaped layers 1b1 and 1b2 which are respectively provided with two portions E15 and E16 of the first electrode. The strip-shaped layers N11, N12 and 1b, 1b2 extend parallel to one another and essentially perpendicular to the plane of the drawing of FIG. 1, as do the portions E13, E14, E15 and E16 of the first electrode. The latter are conducted with the portions E11 and E12 to a terminal L1.

A first semiconductor region 4, which is p-conductive and extends up to the boundary surface F of the semiconductor body is included in the layer N11. The region 4 is contacted by the portion E13 in the boundary surface F. A second p-conductive semiconductor region 5, which consists of the zone of a p-base layer 1a which extends up to the boundary surface F and separates the layers N1 and N11 from one another is also provided. An n-conductive intermediate layer 6, which consists of a portion of the layer N11, is located between the semi-conductor regions 4 and 5. This intermediate layer 6 is covered by a thin, electrically insulating layer comprising, for example, $SiO_2$, arranged at the boundary surface F, the layer being provided with a gate 8. The gate 8 is connected to a terminal G1. The elements 4–8 form a MIS structure controllable by way of the terminal G1. If this belongs to the depletion type, then, without the influence of a voltage at the gate 8, a p-conductive inversion channel 9 exists at the boundary surface F between the regions 4 and 5, the inversion channel 9 conductively connecting these to one another. If one applies a positive control voltage to the terminal G1, then the inversion channel is eliminated. If the MIS structure is of the enhancement type, then, given the voltage-free gate 8, no inversion channel exists. This is only constructed due to the application of a negative control voltage to the terminal G1 by means of inversion of the intermediate layer 6 beneath the gate 8.

The inversion channel 9, therefore, represents a controllable emitter short circuit path which either connects or does not connect the base layer 1a to the region 4 and, therefore, to the portion E13 of the first electrode as a function of a control voltage supplied to the terminal G1, the connection being a low resistance connection.

A further MIS structure which likewise contains an emitter short circuit path extending between the layer 1a and the portion E13 of the first electrode occurs by the arrangement of a p-conductive region 10, an electrically insulating layer 11 of, for example, $SiO_2$, and a gate 12 arranged on the layer 11, the gate being likewise connected to the terminal G1. Whereas the first short circuit path which consists of the inversion channel 9 is arranged at the left-hand edge of the layer N11, the second short circuit path is located at the right-hand edge of the layer N11. Two emitter short circuit paths which optionally connect the element 1a to the portion E14 are provided in the same manner at the sides of the layer N12. Further emitter short circuit paths connect the layer 2b to the portion E15 and the layer 2b to the portion 16 of the first electrode. Thereby, the drive of the gate (not referenced in detail) of the MIS structures lying laterally from the element 1b1 and 1b2 occur by way of a common terminal G2. Since the conductivity types of the portions of the latter MIS structures are opposite to those of the MIS structures 4–7, control voltages which have the opposite polarity of those control voltages which apply to the terminal G1 are respectively to be supplied to the terminal G2.

Given MIS structures of the depletion type, the emitter short circuits are respectively active given voltage-free terminals G1 and G2. If one applies an alternating voltage to the terminals L1 and L2, which first reduces the potential at the terminal L1 on comparison to the potential of the terminal L2, then the first thyristor 6 is in the block condition in which, despite the voltage applied in the forward-conducting direction at the terminals L1, L2, allows of no load current between the terminals L1 and L2. The thermally-generated hole electrons are diverted from the base layer 1b by way of the active short circuit path to the first electrode, so that no charge carriers are injected from the n-emitter layer N11 and N12 into the base layer 1a. So-called fixed emitter short circuits 13 are provided in the layer N1 so that no charge carriers can be injected into the base layer 1a from the portion of the emitter layer referenced N1.

These emitter short circuits 13 consists of portions of the base layer 1a which extend through the layer N1 and extend up to the boundary surface F in which they are contacted by the portion E11. The effect, of these fixed short circuits, thereby, is the same as that of the emiitter short circuit path which are always switched on. Therefore, due to the arrangement of the fixed short circuits 13, it is achieved that the charge carriers are also not injected into the base layer 1a from the layer N1.

If a positive voltage pulse P1 is now supplied to the terminal G1, then the controllable short circuit paths laterally from the layers N11 and N12 are interrupted. The layers N11 and N12 begin to inject charge carriers into the base layer 1a and the first thyristor triggers. The triggering, which at first begins only in the area of the layers N11 and N12, also spreads to that portion of the n-emitter layer N1. As can be seen from FIG. 2, a load current $i_L$ begins to flow after the occurrence of the pulse P1, namely there occurs a dependency of the load current $i_L$ on the time t provided by the curve 14.

Until the time t1, the right-hand thyristor is poled in a non-conductive direction by way of the terminals L1 and L2 so that it is not triggered and no load current component can flow thereacross.

Since its emitter short circuit paths arranged edgewise with respect to the layers 1b1 and 1b2 are switched on because of the voltage-free terminal G2, charge carriers which have arrived from the area of the triggered left-hand thyristor into the boundary area between both thyristors can be diverted across the portions E15 and E16. This is also true for the time after t1 in which the left-hand thyristor is blocked because of the zero pause of the voltage adjacent to the terminals L1 and L2, and the right-hand thyristor is poled in the forward-conducting direction. It is only upon occurrence of the negative voltage pulse P2 at the terminal G2, that the emitter short circuit paths lying laterally from the elements 1b1 and 1b2 are interrupted, so that the hole electrons arrive from the base layer 2b to the pn junctions between the elements 1b1 and 1b2 and 2b, and the layers 1b1 and 1b2 inject charge carriers into the base layer 2b. Only at the time t2 does the transfer of the right-hand thyristor from the blocked state into the current-conductive state then begin, as also proceeds from the current curve 14 in FIG. 2. The right-hand thyristor in FIG. 1 carries the load current $i_L$ until the next successive zero pause at the time t3 of the voltage applied to the terminals L1 and L2.

Figure 2:
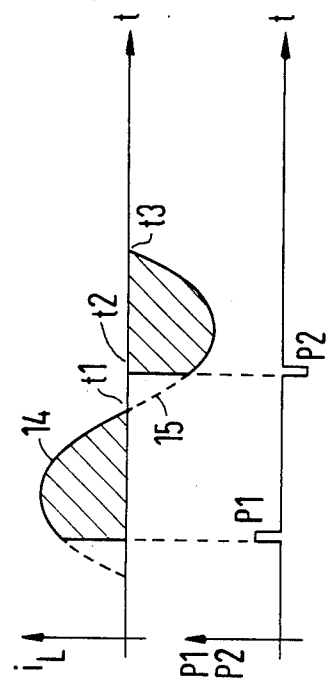
FIG. 2 is a tIming diagram for explaining the arrangement according to FIG. 1.

Without the described effect of the emitter short circuit paths arranged laterally with respect to the elements 1b1 and 1b2, an undesired triggering of the right-hand thyristor would occur before the time t2, since charge carriers occurring from the left-hand thyristor and arriving from the layer 2a in the region of the layer 2b would cause a premature triggering. In this case, the load current $i_L$ would not decrease, as desired, to zero in the time interval between the times t1 and t2 but, rather, would correspond to the curve portion 15 which is indicated in FIG. 2 with broken lines. Therewith, a normal switching operation of a triac would not be possible.

For the purpose of better stability of the thyristor shown at the right in FIG. 1, fixed short circuits 16 of the type already described are provided in the n-emitter layer N2. These prevent an undesired triggering of the right-hand thyristor in the time interval from the time t1 to the time t2 in the area of the layer N2.

According to a further development of the invention, the terminals G1 and G2 can be connected to one another. Thereby, double pulses P1, P2 in accordance with FIG. 2, are supplied to both terminals. The manner of operation of the triac is not changed by this connection and application of voltage pulses.

According to an embodiment of the invention, a trigger electrode 17 can be provided on the base layer of one of the two thyristors in order to promote and accelerate the triggering operations of both thyristors. This trigger electrode 17, according to FIG. 1, contacts both the p-base 1a and the n-conductive control region 18 which lies within the layer 1a. Upon occurrence of a positive trigger pulse P1' which arrives at the electrode 17 by way of a terminal Z of a trigger circuit Z1, a trigger pulse is fed into the base 1a. Upon occurrence of a negative trigger pulse P2', charge carriers arrive in a manner known per se from the control region 18 into the base layer 2b and accelerate the trigger operation of the right-hand thyristor. If one connects the terminals G1 and G2 to the terminal Z, then the positive and negative trigger voltage pulses which can be tapped at such point are employed as control pulses P1 and P2.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a triac of the type in which a multilayer semiconductor body is arranged between first and second electrodes, in which there is a first thyristor and a second thyristor, a first, p-conductivity layer forms a base of the first thyristor and an emitter of the second thyristor, in which a second, n-conductivity layer forms bases for both thyristors, in which a third, p-conductivity layer forms an emitter of the first thyristor and a base of the second thyristor, in which a fourth, n-conductivity layer of the first thyristor is located in the first layer and contacts the first electrode, and in which a fifth, n-conductivity layer is located in the third layer and contacts the second electrode, the improvement therein comprising:
 an n-conductivity emitter region in the first layer adjacent and laterally spaced from the fourth layer in the direction of the second thyristor;
 a p-conductivity emitter region in the second layer laterally spaced from the first layer in the direction of the first thyristor;
 emitter electrodes contacting respective emitter regions; and
 gate-controlled metal-insulator-semiconductor structures at each of said n-conductivity and p-conductivity emitter regions, including gate-controlled short circuit paths,
 said short circuit paths bridging the pn junctions between said n-conductivity emitter region and said first layer and said p-conductivity emitter region and said second layer, respectively.

2. The improved triac of claim 1, wherein each of said emitter short circuit paths comprises:
 a first semiconductor region of a first conductivity contacting the emitter electrode of the appertaining emitter region;
 a second semiconductor region of the first conductivity connected to a base adjacent the appertaining emitter region;
 a third semiconductor region of a second conductivity intermediate and contacting said first and second semiconductor regions; and
 an insulated gate carried on the intermediate third semiconductor region.

3. The improved triac of claim 2, wherein: said first semiconductor region is located adjacent a lateral edge zone of the appertaining emitter region and extends up to the boundary surface of the semiconductor body to contact the appertaining emitter electrode;
 said second semiconductor region is formed of and comprises a zone of the adjacent base which extends up to the boundary surface; and
 said third semiconductor region is formed of and comprises a portion of the appertaining emitter region.

4. The improved triac of claim 1, wherein: said emitter regions are each divided into a plurality of strips; said emitter electrodes are each divided into a plurality of portions each contacting a respective emitter region strip; and
 a plurality of said emitter short circuit paths is provided, each located adjacent an edge of an emitter region strip.

5. The improved triac of claim 4, and further comprising: a common terminal connected to said gates of both of the thyristors.

6. The improved triac of claim 1, and further comprising:
 a trigger electrode contacting a p-conductivity base of one of the thyristors for connection to a trigger circuit; and
 a control region in such base contacting said trigger electrode and having a conductivity opposite to that of the base.

7. The improved triac of claim 6, and further comprising:
 a common terminal connected to said gates of both thyristors and connected to said trigger electrode.

8. The improved triac of claim 1, wherein:
 the first and third layers each include portions extending through the fourth and fifth layers, respectively, and contacting the first and second electrodes, respectively.

9. A method of operating a triac of the type in which a multilayer semiconductor body is arranged between first and second electrodes, in which there is a first thyristor and a second thyristor, in which a first, p-conductivity layer forms a base of the first thyristor and an emitter of the second thyristor, in which a second n-conductivity layer forms the bases for both thyristors, in which a third, p-conductivity layer forms an emitter of the first thyristor and a base of the second thyristor, in which a fourth, n-conductivity layer of the first thyristor is located in the first layer and contacts the first electrode, in which a fifth, n-conductivity layer is located in the third layer and contacts the second electrode, in which an n-conductivity emitter region is located in the first layer laterally spaced from the fourth layer, in which a p-conductivity emitter region is located in the second layer laterally spaced from the first layer, in which emitter electrodes contact respective emitter regions, in which gate-controlled metal-insulator-semiconductor structures are located at each of the n-conductivity and p-conductivity emitter regions and include gate-controlled short circuit paths, the short circuit paths bridging the pn junctions between said n-conductivity emitter region and said first layer and said p-conductivity emitter region and said second layer, respectively, in which the emitter regions are each divided into a plurality of strips, in which emitter electrodes are each divided into a plurality of portions and each contact a respective emitter region strip, in which a plurality of emitter short circuit paths is provided, each located adjacent an edge of an emitter region strip, in which a plurality of insulated gates are provided, each located over at least one edge of an emitter region and connected to a common gate terminal so that each thyristor has a respective common gate terminal, comprising the steps of:
 applying voltage pulses of a first polarity to the common gate terminal of the first thyristor; and
 applying voltage pulses of an opposite second polarity to the common gate terminal of the second thyristor.

10. The method of claim 9, wherein the common gate terminals are also connected in common, and further comprising the step of alternately applying the first and second pulses to the commonly-connected common gate terminals.

* * * * *